(12) United States Patent
Li et al.

(10) Patent No.: US 10,395,931 B2
(45) Date of Patent: Aug. 27, 2019

(54) LDMOS TRANSISTOR, ESD DEVICE, AND FABRICATION METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventors: Yong Li, Shanghai (CN); Cheng Qing Wei, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 0 days.

(21) Appl. No.: 15/471,612

(22) Filed: Mar. 28, 2017

(65) Prior Publication Data
US 2017/0345660 A1    Nov. 30, 2017

(30) Foreign Application Priority Data
May 27, 2016 (CN) .......................... 2016 1 0365140

(51) Int. Cl.
| | | |
|---|---|---|
| *H01L 29/36* | (2006.01) | |
| *H01L 21/265* | (2006.01) | |
| *H01L 27/02* | (2006.01) | |
| *H01L 29/06* | (2006.01) | |

(Continued)

(52) U.S. Cl.
CPC .... *H01L 21/26586* (2013.01); *H01L 27/0255* (2013.01); *H01L 27/0266* (2013.01);
(Continued)

(58) Field of Classification Search
None
See application file for complete search history.

(56) References Cited

U.S. PATENT DOCUMENTS 6,924,531 B2 *   8/2005   Chen ................... H01L 29/1083
                                                     257/122
8,890,243 B2 * 11/2014   Yanagi ................ H01L 29/7816
                                                     257/337

(Continued)

OTHER PUBLICATIONS

The European Patent Office (EPO) The Extended European Search Report for 17171967.7 dated Aug. 18, 2017 9 Pages.

(Continued)

*Primary Examiner* — Bilkis Jahan
(74) *Attorney, Agent, or Firm* — Anova Law Group, PLLC

(57) ABSTRACT

A method is provided for fabricating an LDMOS transistor. The method includes providing a base substrate. The method also includes forming a first well area doped with a first well ion in the base substrate. In addition, the method includes forming a second well area doped with a second well ion in the base substrate, where the second well area includes a first region adjacent to the first well area. Moreover, the method includes forming a first ion doping region doped with first ions in the first well area and the first region, where a type of the first ions is the same as a type of the first well ion and opposite to a type of the second well ion. Further, the method includes forming a gate structure on part of the first well area and part of the first region.

20 Claims, 8 Drawing Sheets

(51) Int. Cl.
    *H01L 29/66*     (2006.01)
    *H01L 29/78*     (2006.01)
    *H01L 29/08*     (2006.01)
    *H01L 29/10*     (2006.01)

(52) U.S. Cl.
    CPC ...... *H01L 29/0649* (2013.01); *H01L 29/0878* (2013.01); *H01L 29/0886* (2013.01); *H01L 29/105* (2013.01); *H01L 29/36* (2013.01); *H01L 29/66545* (2013.01); *H01L 29/66659* (2013.01); *H01L 29/66681* (2013.01); *H01L 29/66689* (2013.01); *H01L 29/785* (2013.01); *H01L 29/7816* (2013.01); *H01L 29/7835* (2013.01); *H01L 29/0653* (2013.01)

(56) References Cited

U.S. PATENT DOCUMENTS

| | | |
|---|---|---|
| 2006/0145250 A1 | 7/2006 | Ma |
| 2009/0179276 A1* | 7/2009 | Voldman ......... H01L 21/823814 257/369 |
| 2011/0108917 A1 | 5/2011 | Shima |
| 2012/0193707 A1 | 8/2012 | Huang et al. |
| 2013/0344673 A1* | 12/2013 | Kurz ............... H01L 21/823418 438/303 |
| 2015/0041893 A1* | 2/2015 | Wang ................. H01L 29/7816 257/339 |
| 2015/0380398 A1* | 12/2015 | Mallikarjunaswamy .................... H01L 29/7823 257/272 |
| 2016/0372360 A1* | 12/2016 | Fang ................. H01L 21/76229 |

OTHER PUBLICATIONS

H. Enichlmair et al., Hot Carrier Stress Degradation Modes in P-Type High Voltage Ldmos Transistors, Reliability Physics Symposium, 2009 IEEE International, IEEE, Piscataway, NJ, USA, Apr. 26, 2009, pp. 426-431.

* cited by examiner

US 10,395,931 B2

LDMOS TRANSISTOR, ESD DEVICE, AND FABRICATION METHOD THEREOF

CROSS-REFERENCES TO RELATED APPLICATIONS

This application claims the priority of Chinese patent application No. 201610365140.8, filed on May 27, 2016 the entirety of which is incorporated herein by reference.

FIELD OF THE INVENTION

The present invention generally relates to the field of semiconductor manufacturing and, more particularly, relates to a laterally diffused metal-oxide-semiconductor field-effect transistor (MOSFET), an electro-static discharge (ESD) device, and fabrication techniques thereof.

BACKGROUND

Power field effect transistor is one of most i important transistors. The power field effect transistors mainly include two types: vertically diffused metal-oxide-semiconductor (VDMOS) transistor, and laterally diffused MOS (LDMOS) transistor. Compared to the VDMOS transistor, the LDMOS transistor has many advantages, such as better thermal stability and frequency stability, higher gain, lower feedback capacitance and thermal resistance, and constant input impedance.

However, such LDMOS transistor formed by existing techniques often cannot improve the hot carrier effect of the LDMOS transistor while adjusting threshold voltage of the LDMOS transistor, thus resulting in reduction of electrical performance of the LDMOS transistor. The disclosed device structures and methods are directed to solve one or more problems set forth above and other problems.

BRIEF SUMMARY OF THE DISCLOSURE

One aspect of the present disclosure includes a method for fabricating an LDMOS transistor. The method includes providing a base substrate. The method also includes forming a first well area in the base substrate, wherein the first well area is doped with a first well ion. In addition, the method includes forming a second well area in the base substrate, wherein the second well area is formed on a side of the first well area and doped with a second well ion, and the second well area includes a first region adjacent to the first well area. Moreover, the method includes forming a first ion doping region in the first well area and the first region, wherein the first ion doping region is doped with first ions, and a type of the first ions is the same as a type of the first well ion and opposite to a type of the second well ion. Further, the method includes forming a gate structure on part of the first well area and part of the first region.

Another aspect of the present disclosure includes an LDMOS transistor and an ESD device. The LDMOS transistor includes a base substrate. The LDMOS transistor also includes a first well area formed in the base substrate, wherein the first well area is doped with a first well ion. In addition, the LDMOS transistor includes a second well area formed in the base substrate, wherein the second well area is formed on a side of the first well area and doped with a second well ion, and the second well area includes a first region adjacent to the first well area. Moreover, the LDMOS transistor includes a first ion doping region formed in the first well area and the first region, wherein the first ion doping region is doped with first ions, and a type of the first ions is the same as a type of the first well ion and opposite to a type of the second well ion. Further, the LDMOS transistor includes a gate structure formed on part of the first well area and part of the first region. The ESD device comprises at least one LDMOS transistor.

Other aspects of the present disclosure can be understood by those skilled in the art in light of the description, the claims, and the drawings of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or the alike parts.

Figure 1:
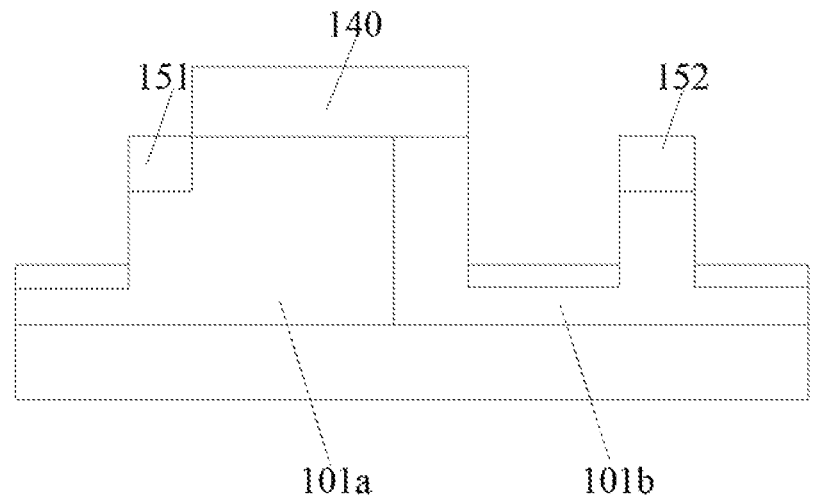
FIG. 1 illustrates an existing LDMOS transistor.

Referring to FIG. 1, art existing LDMOS transistor includes a substrate having a first well area 101a and a second well area 101b formed on a side of the first well area 101a and contacting with the first well area 101a. The first well area 101a is doped with a first well ion, and the second well area 101b is doped with a second well ion. The type of the first well ion is opposite to the type of the second well ion. The existing LDMOS transistor also includes a gate structure 140 formed on pan of the first well area 101a and part of the second well area 101b. Further, the existing LDMOS transistor includes a source region 151 formed in the first well area 101a on one side of the gate structure 140, and a drain region 152 formed in the second well area 101b on the other side of the gate structure 140.

The first well area 101a is also doped with first ions, which are suitable to adjust threshold voltage of the LDMOS transistor. The type of the first ions is the same as the type of the first well ion.

However, because the first well area 101a is doped with the first ions, and the type of the first ions is the same as the type of the first well ion. When the type of the LDMOS transistor is P-type, both the type of the first ions and the type of the first well ion are N-type. When the type of the LDMOS transistor is N-type, both the type of the first ions and the type of the first well ion are P-type. Thus, when the type of the LDMOS transistor is P-type, concentration of N-type ions in the first well area 101a increases. When the type of the LDMOS transistor is N-type, concentration of P-type ions in the first well area 101a increases. Therefore, the width of a depletion layer formed between the first well area 101*a* and the second well area 101*b* is reduced, and the hot carrier effect in the LDMOS transistor can be more serious. Thus, in the above-described embodiment, the hot carrier effect of the LDMOS transistor is aggravated while adjusting threshold voltage of the LDMOS transistor, resulting in reduction of the electrical performance of the LDMOS transistor.

Figure 14:
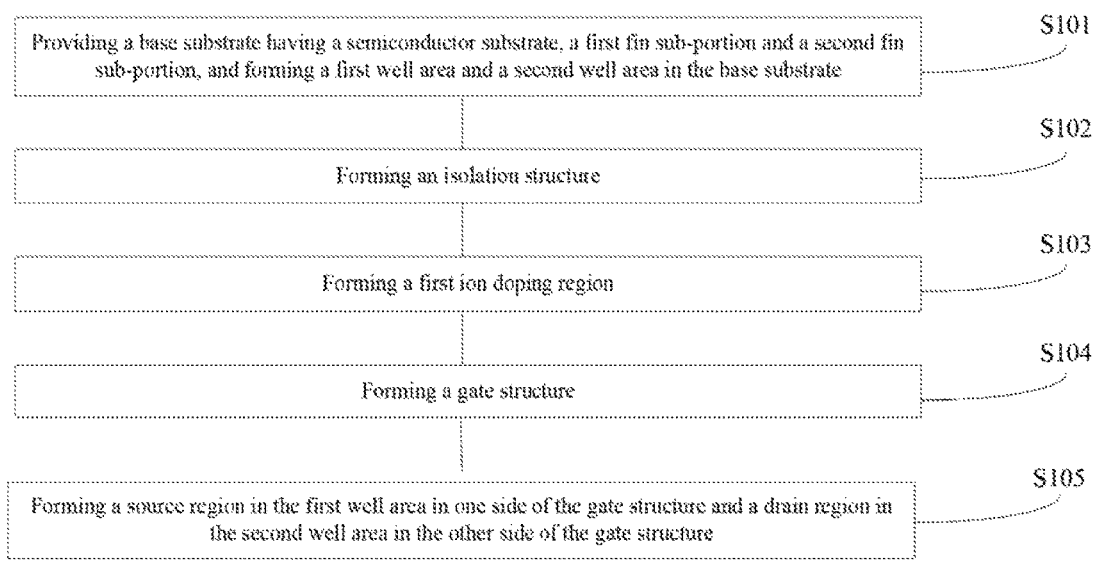
FIG. 14 illustrates an exemplary fabrication process to form an LDMOS transistor consistent with the disclosed embodiments.

The present disclosure provides an improved LDMOS device structure and fabrication method. FIG. 14 illustrates an exemplary fabrication process to form an LDMOS transistor consistent with the disclosed embodiments; and FIGS. 2-7 illustrate semiconductor structures corresponding to certain stages of the exemplary fabrication process.

Figure 2:
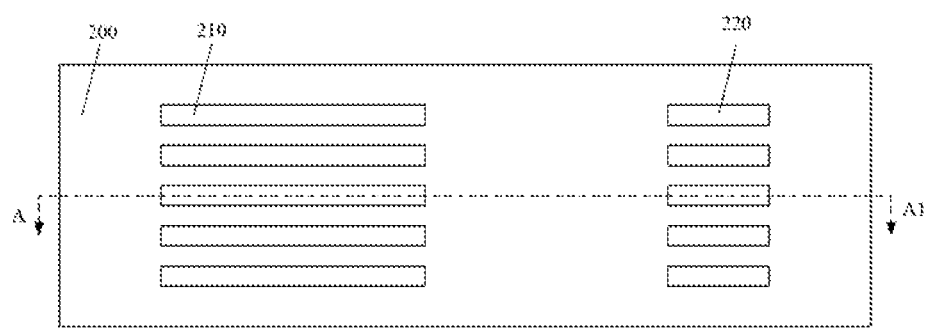
FIGS. 2-7 illustrate semiconductor structures corresponding to certain stages of a fabrication process of an LDMOS transistor consistent with the disclosed embodiments.
Figure 3:
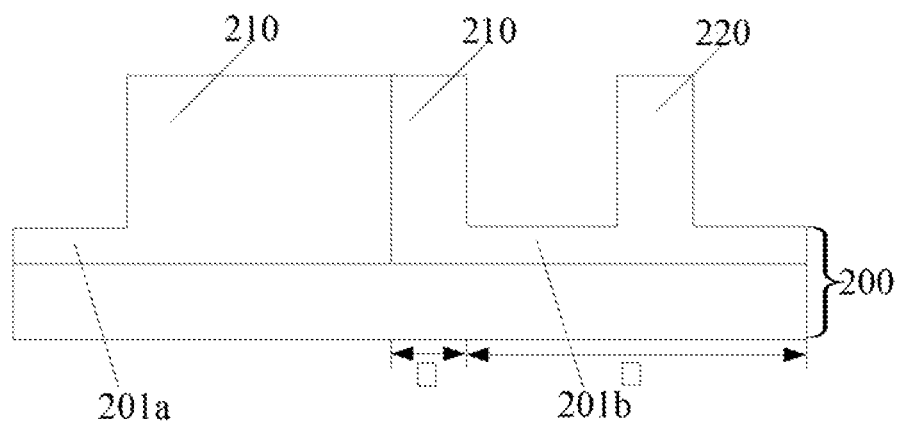

As shown in FIG. 14, at the beginning of the fabrication process, a base substrate with certain structures may be provided (S101). FIGS. 2-3 illustrate a corresponding semiconductor structure.

Referring to FIG. 2 and FIG. 3, where FIG. 3 is a cross-sectional view along an A-A1 line in FIG. 2, a base substrate may be provided. In one embodiment, the base substrate may include a semiconductor substrate 200 and a fin portion formed on the semiconductor substrate 200. In certain other embodiments, the base substrate may be a semiconductor substrate.

The semiconductor substrate 200 may include monocrystalline silicon polysilicon, amorphous silicon. The semiconductor substrate 200 may also include germanium (Ge), germanium-silicon alloy (GeSi), silicon carbide (SiC), or gallium arsenide (GaAs) and other appropriate semiconductor materials. In one embodiment, the semiconductor substrate 200 may be silicon.

The fin portion may include a first fin sub-portion 210 and a second fin sub-portion 220 adjacent to the first fin sub-portion 210. A direction from the first fin sub-portion 210 to the second tin sub-portion 220 may be parallel to the extension direction of the fin portion (A-A1).

In one embodiment, the first fin sub-portion 210 and the second fin sub-portion 220 may be formed by etching the semiconductor substrate 200. Or the first fin sub-portion 210 and the second fin sub-portion 220 may be formed by forming a fin portion material layer on the semiconductor substrate 200, and then patterning the fin portion material layer to form the first fin sub-portion 210 and the second fin sub-portion 220.

Referring to FIG. 2 and FIG. 3, a first well area 201*a* and a second well area 201*b* may also be formed in the base substrate. The first well area 201*a* may be doped with a first well ion. The second well area 201*b* may be formed on a side of the first well area 201*a*, and the second well area 201*b* may be doped with a second well ion. The second well area 201*b* may include a first region I adjacent to the first well area 201*a*.

In one embodiment, the first well area 201*a* and part of the second well area 201*b* may be formed in the first fin sub-portion 210*a* and the semiconductor substrate 200 under the first fin sub-portion 210*a*. The first well area 201*a* and the second well area 201*b* may be arranged along the direction from the first fin sub-portion 210 to the second fin sub-portion 220. The second well area 201*b* may extend along the direction from the first fin sub-portion 210 to the second fin sub-portion 220 into the second fin sub-portion 220 and the semiconductor substrate 200 under the second fin sub-portion 220.

In certain other embodiments, when the base substrate is a semiconductor substrate, the first well area and the second well area may be formed in the semiconductor substrate. The second well area may be formed on the side of the first well area. The second well area may include a first region adjacent to the first well area.

The first well area 201*a* may be configured as a lateral diffusion region to form a channel with a concentration gradient. The second well area 201*b* may be configured as a drift region to bear large partial pressure.

Forming the first well area 201*a* may include forming a first mask layer (not labeled) on the base substrate, where the first mask layer may expose the surface of the base substrate corresponding to the first well area 201*a*; and using the first mask layer as a mask, a first well ion implantation process may be performed to implant the first well ion into the base substrate, to form the first well area 201*a*.

Forming the second well area 201*b* may include forming a second mask layer (not labeled) on the base substrate, where the second mask layer may expose the surface of the base substrate corresponding to the second well area 201*b*; and using the second mask layer as a mask, a second well ion implantation process may be performed to implant the second well ion into the base substrate, to form the second well area 201*b*.

The first well area 201*a* may be formed first, then the second well area 201*b* may be formed. Or the second well area 201*b* may be formed first, then the first well area 201*a* may be formed.

The first well area 201*a* may be doped with the first well ion, and the second welt area 201*b* may be doped with the second well ion. The type of the first well ion may be opposite to the type of the second well ion. When the type of the LDMOS transistor is P-type, the type of the first well ion is N-type, and the type of the second well ion is P-type. When the type of the LDMOS transistor is N-type, the type of the first well ion is P-type, and the type of the second well ion is N-type.

The second well area 201*b* may include the first region I and a second region II. The first region I may be adjacent to the first well area 201*a*, and the second region II may be adjacent to the first region I. The first well area 201*a* and the second region II may be formed at both sides of the first region I. A gate structure may be subsequently formed on the first well area and the first region.

In one embodiment, part of the second well area 201*b* may be formed in the first fin sub-portion 210 and the semiconductor substrate 200 under the first fin sub-portion 210. Part of the second well area 201*b* may be formed in the semiconductor substrate 200 between the first fin sub-portion 210 and the second fin sub-portion 220. Part of the second well area 201*b* may be formed in the second fin sub-portion 220 and the semiconductor substrate 200 under the second fin sub-portion 220. The second well area 201*b* formed in the first fin sub-portion 210 and in the semiconductor substrate 200 under the first fin sub-portion 210 may be the first region I. The second well area 201*b* formed in the semiconductor substrate 200 between the first fin sub-portion 210*a* and the second fin sub-portion 220 and formed in the second fin sub-portion 220 and in the semiconductor substrate 200 under the second fin sub-portion 220 may be the second region II.

Figure 4:
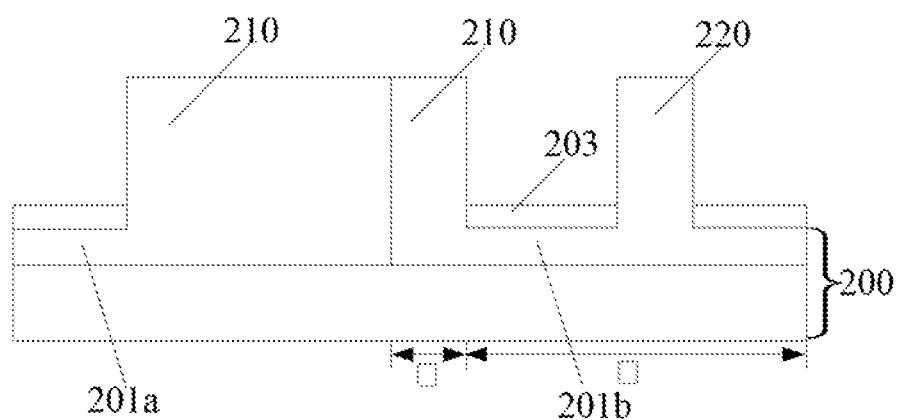

Returning to FIG. 14, after providing the base substrate, an isolation structure may be formed (S102). FIG. 4 illustrates a corresponding semiconductor structure.

Referring to FIG. 4, where FIG. 4 is a schematic diagram formed on the basis of FIG. 3, an isolation structure 203 may be formed in the second region II. In one embodiment, the isolation structure 203 may be configured to electrically isolate the first fin sub-portion 210 and the second fin sub-portion 220.

In one embodiment are isolation layer may be formed on the semiconductor substrate 200 between the adjacent first fin sub-portion 210 and between the adjacent second fin sub-portion 220 (not labeled). The top surface of the isolation layer may be lower than the top surfaces of the first fin sub-portion 210 and the second fin sub-portion 220, such that the adjacent first fin sub-portion 210 may be electrically isolated and the adjacent second fin sub-portion 220 may be electrically isolated. The isolation structure and the isolation layer may be made of silicon oxide, silicon oxynitride, or silicon oxycarbide, etc.

In one embodiment, the top surface of the isolation structure 203 may be lower than the top surfaces of the first well area 201a and the second well area 201b. In certain other embodiments, the top surface of the isolation structure 203 may be level with the top surfaces of the first well area 201a and the second well area 201b.

Forming the isolation structure and the isolation layer may include forming an isolation material layer. The isolation material layer may be formed on the semiconductor substrate 200 between the first fin sub-portion 210 and the second fin sub-portion 220, the semiconductor substrate 200 between the adjacent first fin sub-portion 210, and the semiconductor substrate 200 between the adjacent second fin sub-portion 220. The top surface of the isolation material layer may be higher than the top surfaces of the first fin sub-portion 210 and the second fin sub-portion 220. Forming the isolation structure and the isolation layer may also include removing part of thickness of the isolation material layer, to form the isolation structure and the isolation layer.

When the top surface of the isolation structure 203 is level with the top surface of the isolation layer, the isolation structure and the isolation layer may be simultaneously formed in one etching process. Correspondingly, only one step of forming the corresponding mask layer and removing the corresponding mask layer may be required, simplifying the process steps.

When the base substrate is a semiconductor substrate, the isolation structure may need to be formed in the second region of the semiconductor substrate. The top surface of the isolation structure may be lower or higher than the top surfaces of the first well area and the second well area. The top surface of the isolation structure may also be level with the top surfaces of the first well area and the second well area. When the base substrate is a semiconductor substrate, the isolation structure may be configured to increase path length of subsequently formed source-drain circuit between a source region and a drain region.

Figure 5:
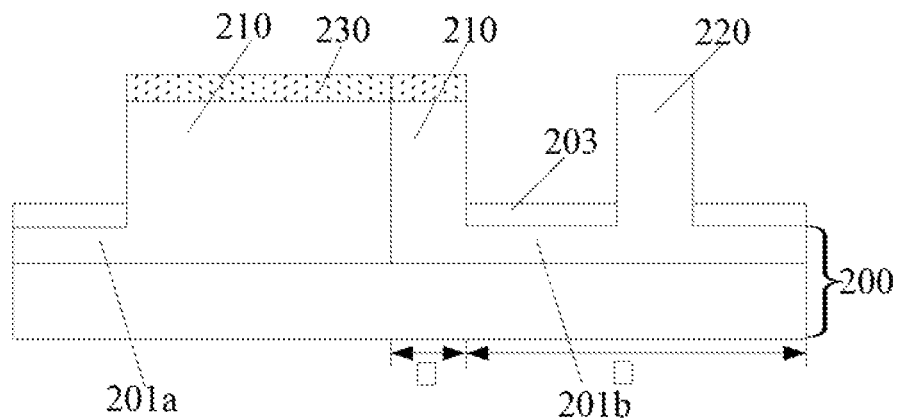

Returning to FIG. 14, after forming the isolation structure, a first ion doping region may be formed (S103). FIG. 5 illustrates a corresponding semiconductor structure.

Referring to FIG. 5, a first ion doping region 230 may be formed in the first well area 201a and the first region I. The first ion doping region 230 may be doped with first ions. The type of the first ions may be the same as the type of the first well ion and opposite to the type of the second well ion.

Forming the first ion doping region 230 may include: forming a third mask layer on the base substrate, where the third mask layer may expose the first well area 201a and the first region I; and using the third mask layer as a mask, a first ion implantation process may be performed to implant the first ions into the first well area 201a and the first region I, to form the first ion doping region 230.

When the type of the LDMOS transistor is P-type, the first ions may be N-type ions, such as P (phosphorus) ions or As ions. When the type of the LDMOS transistor is N-type, the first ions may be P-type ions, such as B ions.

The first ion implantation process may need to select appropriate implantation dose. If the implantation dose is too large, concentration of the first ions may be too large, so as to increase concentration gradient of the channel formed by the first well area configured as the lateral diffusion region. At the same time, if the implantation dose is too large, the first ions may neutralize more of the second well ion, so as to decrease the partial pressure bore by the second well area configured as the drift region.

The first ion implantation process may need to select appropriate implantation energy. If the implantation energy is too large, it may cause damages to the surfaces of the first well area and the first region. If the implantation energy is too small, it may not effectively implant the first ions into the first well area and the first region. Different first ions may correspond to different implantation energy ranges.

When the first ions are N-type ions, in one embodiment, parameters of the first ion implantation process may include: the first ions may be As ions; the implantation dose may be in a range of approximately $2\times10^{12}$-$3\times10^{4}$ atoms/cm$^3$; the implantation energy may be in a range of approximately 3-6 KeV, and the implantation angle may be in a range of approximately 0~10 degree. In another embodiment, parameters of the first ion implantation process may include: the first ions may be P ions; the implantation dose may be in a range of approximately $2\times10^{12}$-$3\times10^{14}$ atoms/cm$^3$; the implantation energy may be in a range of approximately 2-3 KeV; and the implantation angle may be in a range of approximately 0~10 degree. The implantation angle may be defined as the angle respected to normal direction of the top surface of the base substrate.

When the first ions are P-type ions, in one embodiment, parameters of the first ion implantation process may include: the first ions may be B ions; the implantation dose may be in a range of approximately $2\times10^{12}$-$3\times10^{14}$ atoms/cm$^3$; the implantation energy may, be in a range of approximately 2-6 KeV; and the implantation angle may be in a range of approximately 0~10 degree. The implantation angle may be defined as the angle respected to the normal direction of the top surface of the base substrate.

The first ion doping region 230 formed in the first well area 201a may be suitable to adjust the threshold voltage of the LDMOS transistor. The threshold voltage of the LDMOS transistor may be defined as the voltage needed to trigger the LDMOS transistors to operate.

Since the type of the first ions may be the same as the type of the first well ion, such that the first ion doping region 230 formed in the first well area 201a may be capable of adjusting the threshold voltage of the LDMOS transistor. Because the type of the first ions may be opposite to the type of the second well ion, the first ions in the first ion doping region 230 formed in the first region I may neutralize part of the second well ion in the first region I, so as to reduce concentration of the ions with type corresponding to the second well ion. Therefore, the width of the depletion layer formed between the first region I and the first well area 201a may be increased, and the electric field intensity in the depletion layer may be reduced, so as to improve the hot carrier effect of the LDMOS transistor.

The first ion doping region 230 may also be doped with second ions. The second ions may be carbon ions, or fluorine ions, etc. The second ions may be configured to further improve the hot carrier effect of the LDMOS transistor.

Figure 6:
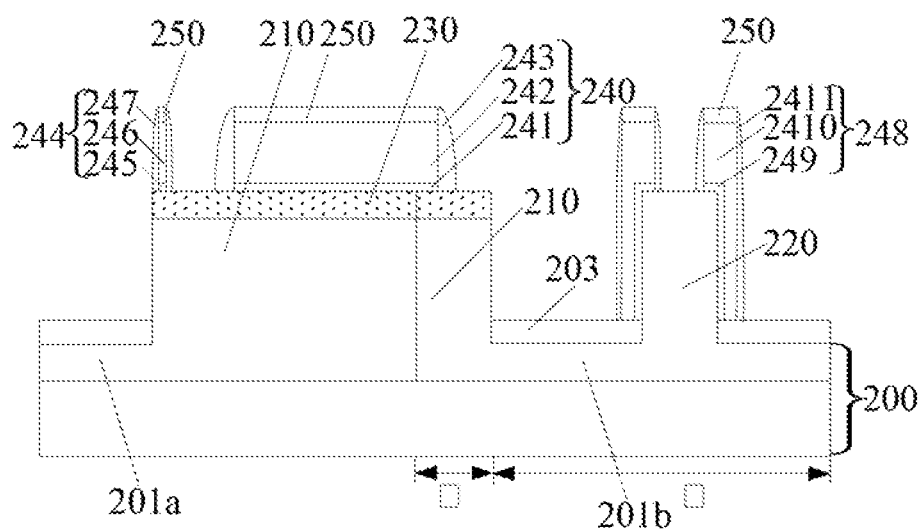

Returning to FIG. 14, after forming the first ion doping region, a gate structure may be formed (S104). FIG. 6 illustrates a corresponding semiconductor structure.

Referring to FIG. 6, a gate structure 240 may be formed on part of the first well area 201a and part of the first region I. The gate structure 240 may include a gate dielectric layer 241 formed on pan of the first well area 201a and part of the first region I, and a gate electrode layer 242 formed on the gate dielectric layer 241. In one embodiment, the gate structure 240 may also include a sidewall spacer 243 formed on side walls of the gate dielectric layer 241 and the gate electrode layer 242. In certain other embodiments, the gate structure may include the sidewall spacer.

The gate dielectric layer 241 may be made of silicon oxide, or high-K dielectric materials, etc. The gate electrode layer 242 may be made of polysilicon. The sidewall spacer 243 may be made of silicon nitride, silicon oxide, or silicon oxycarbide, etc.

In one embodiment, the gate structure 240 may cross the first fin sub-portion 210 and cover part of top surface and side wall of the first fin sub-portion 210. The gate dielectric layer 241 may be formed on the isolation layer and cover part of top surface and sidewall of the first fin sub-portion 210.

In one embodiment, a first barrier structure 244 may be formed, crossing the first well area 201a the first fin sub-portion 210. A source region may be subsequently formed in the well area 201a between the first barrier structure 244 and the gate structure 240.

The first barrier structure 244 may be configured to work together with the gate structure to limit the space of forming the source region during the subsequent process of forming the source region, so as to void forming subsidence damages in the source region close to the first barrier structure 244 compared to the source region close to the gate structure 240. The first barrier structure 244 may also be configured to subsequently limit the region of forming the source region, so as to limit the lateral dimensions of the source region.

In one embodiment, a second barrier structure 248 may be formed, crossing the second fin sub-portion 220. The second barrier structure 248 may be formed at both sides of subsequently formed drain region. The second barrier structure 248 may be configured to limit the space of forming the drain region during the subsequent process of forming the drain region, so as to limit the lateral dimensions of the drain region.

In one embodiment, the first barrier structure 244 and the second barrier structure 248 may be formed while forming the gate structure 240. The first barrier structure 244 may include a first barrier dielectric layer 245 crossing the first well area 201a in the first fin sub-portion 210, and a first barrier electrode layer 246 formed on the first barrier dielectric layer 245. The second barrier structure 248 may include a second barrier dielectric layer 249 crossing the second fin sub-portion 220, and a second barrier electrode layer 2410 formed on the second barrier dielectric layer 249. In certain other embodiments, the gate structure 240, the first barrier structure 244 and the second barrier structure 248 may be separately formed in different processes.

In one embodiment, the first barrier structure 244 may also include a first barrier sidewall spacer 247 formed on side walls of the first barrier dielectric layer 245 and the first barrier electrode layer 246. The second barrier structure 248 may also include a second barrier sidewall spacer 2411 formed on side walls of the second barrier dielectric layer 249 and the second barrier electrode layer 2410. In certain other embodiments, the first barrier sidewall spacer and the second barrier sidewall spacer may not be formed.

The first barrier dielectric layer 245, the second barrier dielectric layer 249 and the gate dielectric layer 241 may be made of the same material. The first barrier electrode layer 246, the second barrier electrode layer 2410 and the gate electrode layer 242 may be made of the same material. The first barrier sidewall spacer 247, the second barrier sidewall spacer 2411 and the sidewall spacers 243 may be made of the same material.

Specifically, forming the gate structure 240, the first barrier structure 244 and the second barrier structure 248 may include: forming a gate dielectric material layer on the base substrate (not labeled); forming a gate electrode material layer on the gate dielectric material layer (not labeled); and patterning the gate electrode material layer and the gate dielectric material layer, to form the gate dielectric layer 241, the gate electrode layer 242, the first barrier dielectric layer 245, the first barrier electrode layer 246, the second barrier dielectric layer 249 and the second barrier electrode layer 2410. The first barrier electrode layer 246, the second barrier electrode layer 2410 and the gate electrode layer 242 may correspond to the gate electrode material layer. The gate dielectric layer 241, the first barrier dielectric layer 245 and the second barrier dielectric layer 249 may correspond to the gate dielectric material layer.

Forming the gate structure 240, the first barrier structure 244 and the second barrier structure 248 may also include: forming a sidewall spacer material layer covering the gate dielectric layer 241, the gate electrode layer 242, the first barrier dielectric layer 245, the first barrier electrode layer 246, the second barrier dielectric layer 249, the second barrier electrode layer 2410 and the base substrate; and using an anisotropic dry etching process to etch the sidewall spacer material layer, to form the first barrier sidewall spacer 247, the second barrier sidewall spacer 2411 and the sidewall spacer 243. Because the first barrier structure 244 and the second barrier structure 248 may be formed while forming the gate structure 240, the fabrication process can be simplified.

In certain other embodiments, the first barrier structure and the second barrier structure may be made of single-layer material. When the first barrier structure and the second barrier structure are made of single-layer material, the first barrier structure and the second barrier structure may be made of insulating materials, such as silicon nitride, or silicon oxide, etc.

In one embodiment, a mask protection layer 250 may be formed on top surfaces of the first barrier electrode layer 246, the second barrier electrode layer 2410 and the gate electrode layer 242. The mask protection layer 250 may be configured as a hard mask layer during patterning the gate electrode material layer and the gate dielectric material layer, to avoid graphic distortion of the formed gate dielectric layer 241, gate electrode layer 242, first barrier dielectric layer 245, first barrier electrode layer 246, second barrier dielectric layer 249, and second barrier electrode layer 2410. The mask protection layer 250 may also be configured to avoid growing a source region-drain region material layer on top surfaces of the first barrier electrode layer 246, the second barrier electrode layer 2410 and the gate electrode layer 242 during subsequently forming the source region and the drain region.

In one embodiment, the mask protection layer 250 may be formed while forming the first barrier electrode layer 246, the second barrier electrode layer 2410, the gate electrode layer 242, the first barrier dielectric layer 245, the second barrier dielectric layer 249 and the gate dielectric layer 241.

The mask protection layer 250 may be made of silicon nitride, silicon oxide, or silicon oxide, etc.

Specifically, forming the mask protection layer 250 may include: after forming the gate electrode material layer, forming a mask protection material layer on the gate electrode material layer; and patterning the mask protection material layer while patterning the gate electrode material layer and the gate dielectric material layer, to form the first barrier electrode layer 246, the second barrier electrode layer 2410, the gate electrode layer 242, the first barrier dielectric layer 245, the second barrier dielectric layer 249, the gate dielectric layer 241 and the mask protection layer 250. The mask protection layer 250 may correspond to the mask protection material layer.

Figure 7:
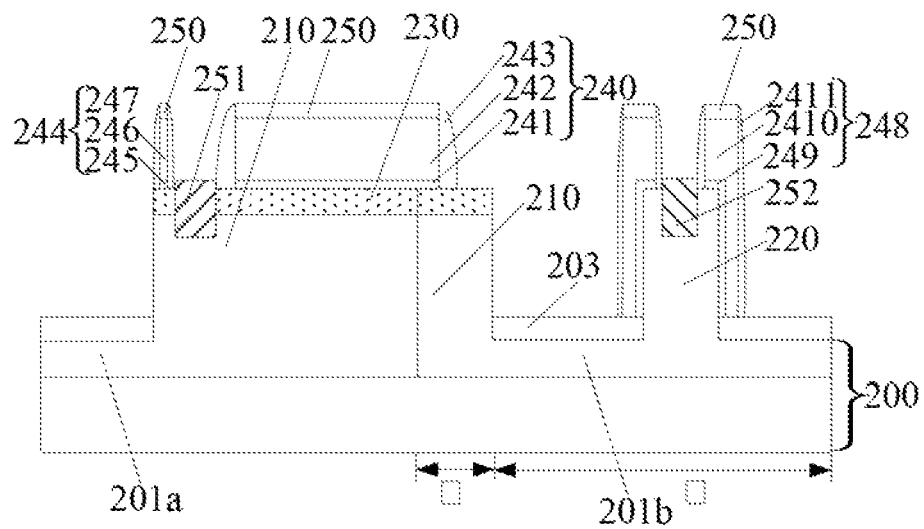

Returning to FIG. 14, after forming the gate structure, a source region and a drain region may be formed (S105). FIG. 7 illustrates a corresponding semiconductor structure.

Referring to FIG. 7, a source region 251 may be formed in the first well area 201a in one side of the gate structure 240, and a drain region 252 may be formed in the second well area 201b in the other side of the gate structure 240.

Forming the source region 251 and the drain region 252 may include: removing part of the first well area 201a between the gate structure 240 and the first barrier structure 244, to form a first groove (not labeled); removing part of the second well area 201b between the adjacent second barrier structures 248, to form a second groove not labeled); and forming a source region-drain region material layer in the first groove and the second groove, therefore to form the source region 251 and the drain region 252.

In one embodiment, the drain region 252 may be formed in the second region II. After forming the drain region, the isolation structure 203 may be formed in the second region II between the first region I and the drain region 252.

Since the first barrier structure 244 may be formed, both side walls of the first groove may expose the first fin sub-portion 210. During forming the source region-drain region material layer, the first fin sub-portion 210 exposed by both side walls of the first groove may be configured as seed of growing the source region-drain region material layer to form the source region 251. Thus, the growth rate of the source region-drain region material layer close to the first barrier structure 244 may be the same as the growth rate of the source region-drain region material layer close to the gate structure 240, so as to avoid forming subsidence damages in the source region close to the first barrier structure 244 with respect to the region close to the gate structure 240.

The first barrier structure 244 can limit the growth area of the source region 251, to limit lateral dimensions of the source region 251. The second barrier structure 248 can limit the growth area of the drain region 252, to limit lateral dimensions of the drain region 252.

In one embodiment, the dimensions of the first ion doping region 230 along the direction normal to the top surface of the base substrate may be smaller than the dimensions of the source region 251 along the direction normal to the top surface of the base substrate. In certain other embodiments, the dimensions of the first ion doping region along the direction normal to the top surface of the base substrate may be larger than the dimensions of the source region along the direction normal to the top surface of the base substrate; or the dimensions of the first ion doping region along the direction normal to the top surface of the base substrate may be equal to the dimensions of the source region along the direction normal to the op surface of the base substrate.

Correspondingly, an LDMOS transistor consistent with the disclosed embodiments is provided. Referring to FIG. 7, the LDMOS transistor may include a base substrate and a first well area 201a formed in the base substrate. The LDMOS transistor may also include a second well area 201b formed in the base substrate. The second well area 201b may be formed on a side of the first well area 201a. The first well area 201a may be doped with first well ion, and the second well area may be doped with the second well ion. The second well area 201b may include a first region I adjacent to the first well area 201a. In addition, the LDMOS transistor may include a first ion doping region 230 formed in the first well area 201a and the first region I. The first ion doping region 230 may be doped with first ions. The type of the first ions may be the same as the type of the first well ion and opposite to the type of the second well ion. Further, the LDMOS transistor may include a gate structure 240 formed on part of the first well area 201a and part of the first region I.

The second well area 201b may also include a second region II. The second region II may be adjacent to the first region I. The second region II and the first well area 201a may be formed at both sides of the first region I.

In one embodiment, the base substrate may include a semiconductor substrate 200 and a fin portion formed on the semiconductor substrate 200. In certain other embodiments, the base substrate may be a semiconductor substrate. The fin portion may include a first fin sub-portion 210 and a second fin sub-portion 220 adjacent to the first fin sub-portion 210. A direction from the first fin sub-portion 210 to the second fin sub-portion 220 may be parallel to the extension direction of the fin portion (A-A1).

The first well area 201a and part of the second well area 201b may be formed in the first fin sub-portion 210a and the semiconductor substrate 200 under the first fin sub-portion 210a. The first well area 201a and the second well area 201b may be arranged along the direction from the first fin sub-portion 210 to the second fin sub-portion 220. The second well area 201b may extend along the direction from the first fin sub-portion 210 to the second fin sub-portion 220 into the second fin sub-portion 220 and the semiconductor substrate 200 under the second fin sub-portion 220.

In one embodiment, part of the second well area 201b may be formed in the first fin sub-portion 210 and the semiconductor substrate 200 under the first fin sub-portion 210. Part of the second well area 201b may be formed in the semiconductor substrate 200 between the first fin sub-portion 210 and the second fin sub-portion 220. Part of the second well area 201b may be formed in the second fin sub-portion 220 and the semiconductor substrate 200 under the second fin sub-portion 220. The second well area 201b formed in the first fin sub-portion 210 and the semiconductor substrate 200 under the first fin sub-portion 210 may be the first region I. The second well area 201b formed in the semiconductor substrate 200 between the first fin sub-portion 210a and the second fin sub-portion 220 and formed in the second fin sub-portion 220 and the semiconductor substrate 200 under the second fin sub-portion 220 may be the second region II.

The first ion doping region formed in the first well area 201a may be suitable to adjust threshold voltage of the LDMOS transistor. When the type of the LDMOS transistor is P-type, the first ions may be N-type ions. When the type of the LDMOS transistor is N-type, the first ions may be P-type ions.

Moreover, the LDMOS transistor may include a source region formed in the well area 201a in one side of the gate structure 240; a drain region 252 formed in the second well area 201b in the other side of the gate structure 240; and an isolation structure 203. Specifically, the drain region 252 may be formed in the second region II. The isolation structure 203 may be formed in the second region II between the first region I and the drain region 252.

Figure 8:
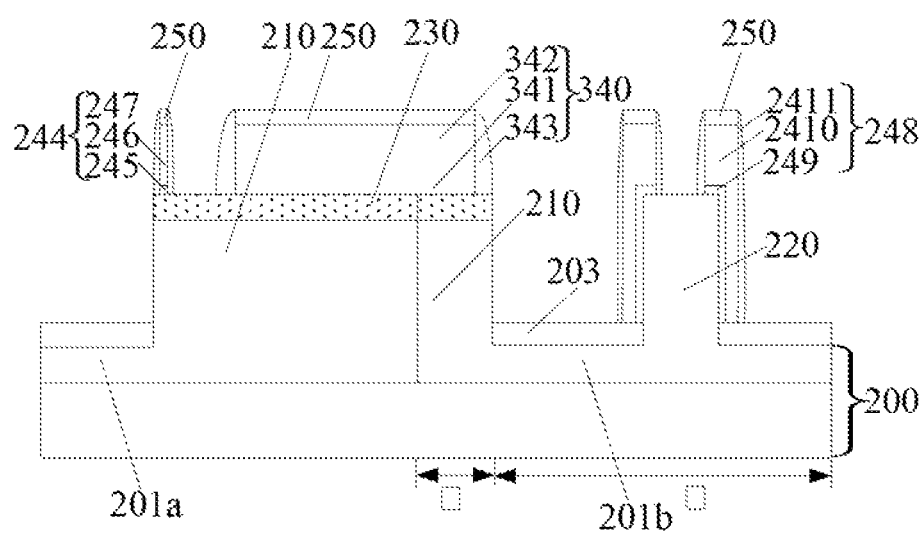
FIGS. 8-9 illustrate semiconductor structures corresponding to certain stages of another fabrication process of an LDMOS transistor consistent with the disclosed embodiments.
Figure 9:
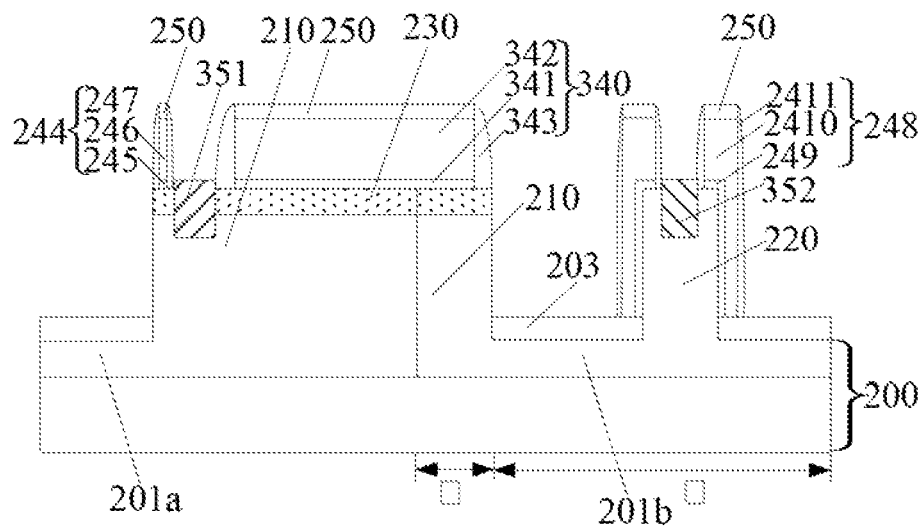

FIGS. 8-9 illustrate semiconductor structures corresponding to certain stages of another fabrication process of an LDMOS transistor consistent with the disclosed embodiments. The difference between the present embodiment and the above-described embodiment may include that the positions of the formed gate structures may be different, and the same or similar features are omitted here.

FIG. 8 illustrates a schematic diagram formed on the basis of FIG. 5. Referring to FIG. 8, a gate structure 340 may be formed on part of the first well area 201a and the entire first region I. The gate structure 340 may include a gate dielectric layer 341 formed on part of the first well area 201a and the entire first region I, and a gate electrode layer 342 formed on the gate dielectric layer 341.

In one embodiment, the gate structure 340 may also include a sidewall spacer 343 formed on side walls of the gate dielectric layer 341 and the gate electrode layer 342. In certain other embodiments, the gate structure may not include the sidewall spacer.

In one embodiment, the gate structure 340 may cross the first fin sub-portion 210 and cover part of top surface and side wall of the first fin sub-portion 210. The gate dielectric layer 341 may be formed on the isolation layer and cover part of top surface and side wall of the first fin sub-portion 210. Forming the gate structure 340 can be referred to the above descriptions associated with forming the gate structure 240 and are omitted here.

Referring to FIG. 9, a source region 351 may be formed in the first well area 201a in one side of the gate structure 340, and a drain region 352 may be formed in the second well area 201b in the other side of the gate structure 340. The position, structure, and fabrication process of the source region 351 and the drain region 352 can be referred to the position, structure, and fabrication process of the source region 251 and the drain region 252, and are omitted here.

Correspondingly, an LDMOS transistor is also provided. The same parts of the LDMOS transistor in the present embodiment and the above-described embodiment are omitted here. The LDMOS transistor may also include a gate structure 340 formed on part of the first well area 201a and the entire first region I. Further, the LDMOS transistor may include a source region 351 formed in the first well area 201a in one side of the gate structure 340; a drain region 352 formed in the second well area 201b in the other side of the gate structure 340; and an isolation structure 203. Specifically, the drain region 352 may be formed in the second region II. The isolation structure 203 may be formed in the second region II between the first region I and the drain region 352.

Figure 10:
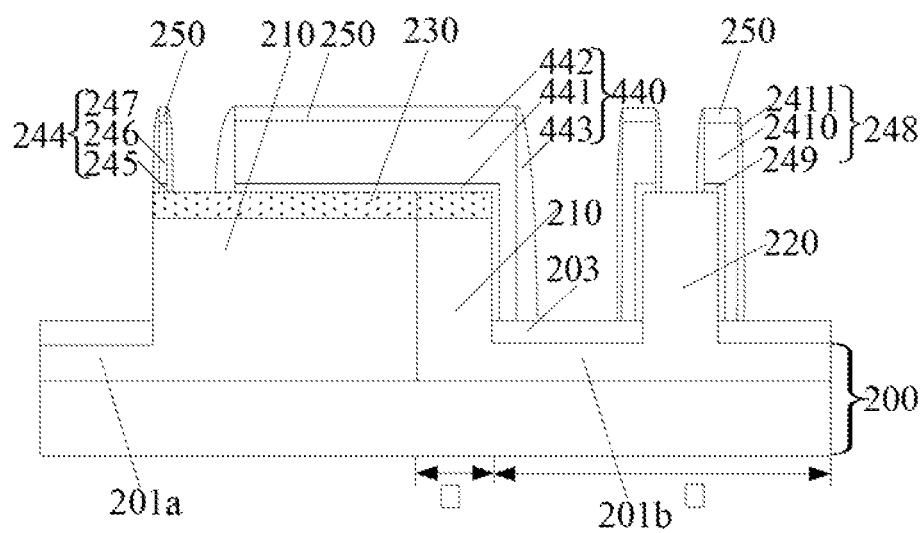
FIGS. 10-12 illustrate semiconductor structures corresponding to certain stages of other fabrication process of an LDMOS transistor consistent with the disclosed embodiments.
Figure 11:
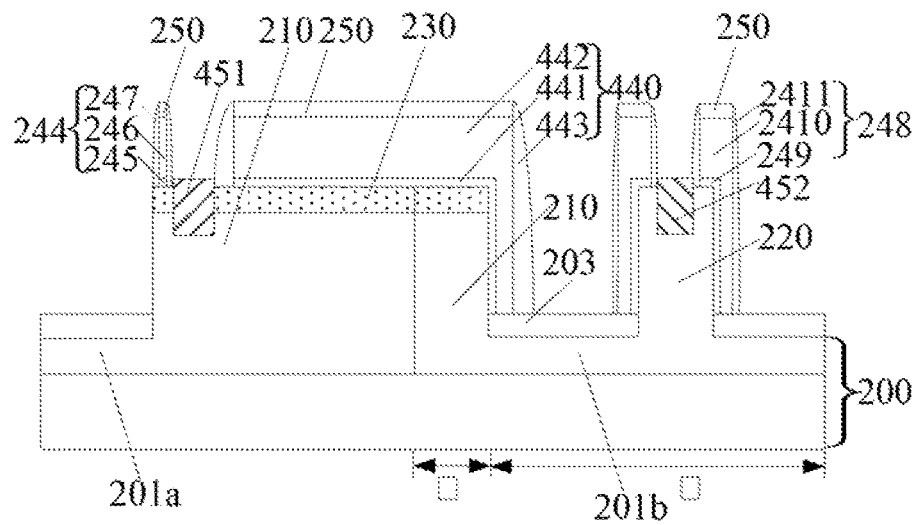

FIGS. 10-11 illustrate semiconductor structures corresponding to certain stages of other fabrication process of an LDMOS transistor consistent with the disclosed embodiments. The difference between the present embodiment and the above-described embodiment may include that the positions of the formed gate structures may be different, and the same or similar features are omitted here.

FIG. 10 illustrates a schematic diagram formed on the basis of FIG. 5. Referring to FIG. 10, a gate structure 440 may be formed on part of the first well area 201a, the entire first region I, and part of the isolation structure 203. The gate structure 440 may include a gate dielectric layer 441 formed on part of the first well area 201a, the entire first region I, and part of the isolation structure 203; and a gate electrode layer 442 formed on the gate dielectric layer 441.

In one embodiment, the gate structure 440 may also include a sidewall spacer 443 formed on the side walls of the gate dielectric layer 441 and the gate electrode layer 442. In certain other embodiments, the gate structure may not include the sidewall spacer.

In one embodiment, the gate structure 440 may cross the first fin sub-portion 210 and cover part of top surface and side wall of the first fin sub-portion 210. The gate dielectric layer 441 may be formed on the isolation layer and cover part of top surface and side wall of the first fin sub-portion 210.

In one embodiment, because the top surface of the isolation structure 203 may be lower than the top surface of the first well area 201a, an opening may be formed between the first well area and the second well area. The side wall of the opening may expose the first well area 201a, such that the gate structure 440 may also be formed on the first well area 201a exposed by the side wall of the opening. Forming the gate structure 440 can be referred to the above descriptions associated with forming the gate structure 240, and are omitted here.

Referring to FIG. 11, a soiree region 451 may be formed in the first well area 201a in one side of the gate structure 440, and a drain region 452 may be formed in the second well area 201b in the other side of the gate structure 440. The position, structure, and fabrication process of the source region 451 and the drain region 452 can be referred to the position, structure, and fabrication process of the source region 251 and the drain region 252, and are omitted here.

Correspondingly, an LDMOS transistor is also provided. The same parts of the LDMOS transistor in the present embodiment and the above-described embodiments are omitted here. The LDMOS transistor may also include a gate structure 440 formed on part of the first well area 201a, the entire first region I, and part of the isolation structure 203.

In one embodiment, because the top surface of the isolation structure 203 may be lower than the top surface of the first well area 201a, an opening may be formed between the first well area and the second well area. The side wall of the opening may expose the first well area 201a, such that the gate structure 440 may also be formed on the first well area 201a exposed by the side wall of the opening.

Further, the LDMOS transistor may include a source region 451 formed in the first well area 201a in one side of the gate structure 440; a drain region 452 formed in the second well area 201b in the other side of the gate structure 440; and an isolation structure 203. Specifically, the drain region 452 may be formed in the second region II. The isolation structure 203 may be formed in the second region II between the first region I and the drain region 452.

In the above-described embodiments, after forming the source region and the drain region, the method may also include forming an interlayer dielectric material layer covering the base substrate, the source region, the drain region, the gate structure, the isolation structure, the first barrier structure, the second barrier structure, and the mask protection layer. The entire surface of the interlayer dielectric material layer may be higher than the surface of the mask protection layer. In addition, the method may include planarizing the interlayer dielectric material layer until the top surfaces of the gate electrode layer, the first barrier electrode layer and the second barrier electrode layer are exposed, to form an interlayer dielectric layer. Moreover, the method may include removing the gate electrode layer and the gate dielectric layer, to form a first groove (not labeled); removing the first barrier electrode layer and the first barrier dielectric layer, to form a second groove (not labeled); and removing the second barrier electrode layer and the second barrier dielectric layer, to form a third groove (not labeled). Further, the method may include forming a metal gate structure in the first groove; forming a first metal barrier structure in the second groove; and forming a second metal barrier structure in the third groove.

Figure 12:
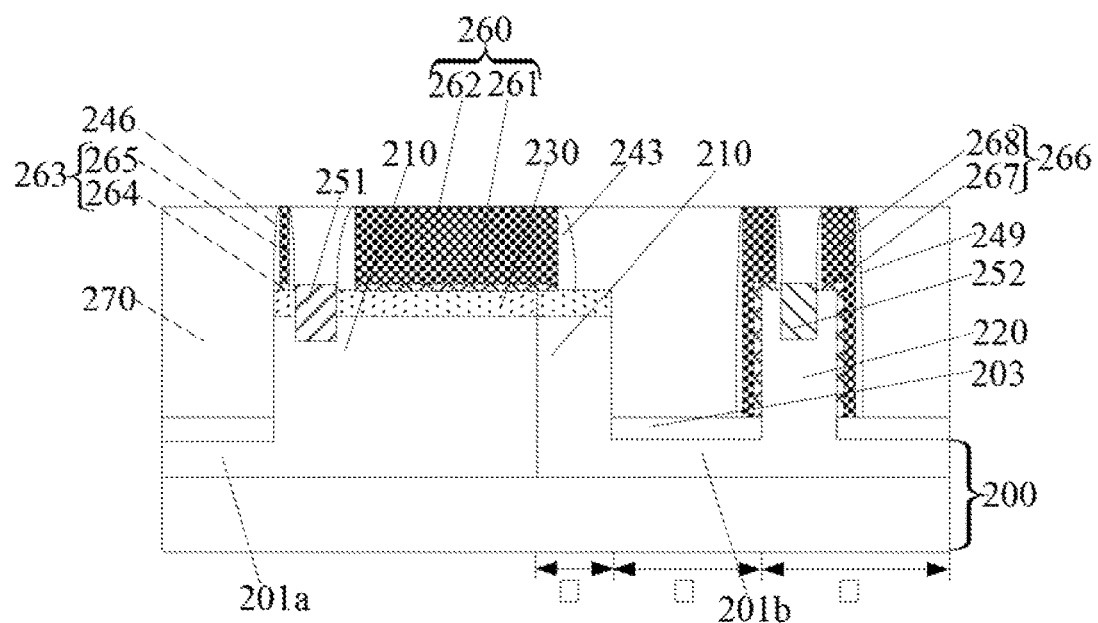

FIG. 12 illustrates a schematic diagram formed on the basis of the FIG. 7. Referring the FIG. 12, after forming the source region 251 and the drain region 252, the method may also include forming an interlayer dielectric material layer covering the base substrate, the source region 251, the drain region 252, the gate structure 240, the isolation structure 203, the first barrier structure 244, the second barrier structure 248, and the mask protection layer 250. The entire surface of the interlayer dielectric material layer may be higher than the surface of the mask protection layer.

In addition, the method may include planarizing the interlayer dielectric material layer until the top surfaces of the gate electrode layer 242, the first barrier electrode layer 246 and the second barrier electrode layer 2410 are exposed, to form an interlayer dielectric layer 270. Moreover, after forming the interlayer dielectric layer 270, the method may include removing the gate electrode layer 242 and the gate dielectric layer 241, to form a first groove (not labeled); removing the first barrier electrode layer 246 and the first barrier dielectric layer 245, to form a second groove (not labeled); and removing the second barrier electrode layer 2410 and the second barrier dielectric layer 249, to form a third groove (not labeled). Further, the method may include forming a metal gate structure 260 in the first groove; forming a first metal bather structure 263 in the second groove; and forming a second metal barrier structure 266 in the third groove.

The metal gate structure 260 may include a metal gate dielectric layer 261 formed on the bottom and side wall of the first groove, and a metal gate electrode layer 262 formed on the metal gate dielectric layer 261. The first metal barrier structure 263 may include a first metal barrier dielectric layer 264 formed on the bottom and side wall of the second groove, and a first metal barrier electrode layer 265 formed on the first metal barrier dielectric layer 264. The second metal barrier structure 266 may include a second metal barrier dielectric layer 267 formed on the bottom and side wall of the third groove, and a second metal barrier electrode layer 268 formed on the second metal barrier dielectric layer 267. In certain other embodiments, the second groove, first metal barrier structure 263, the third groove, and the second metal barrier structure 246 may not be formed.

Correspondingly, a method of forming an electrostatic discharge (ESD) device is provided, which may include forming an LDMOS transistor. The LDMOS transistor may be formed by the above-described method of firming the LDMOS transistor. Also, an ESD device is provided, including an LDMOS transistor formed by the above-described method of forming the LDMOS transistor.

Figure 13:
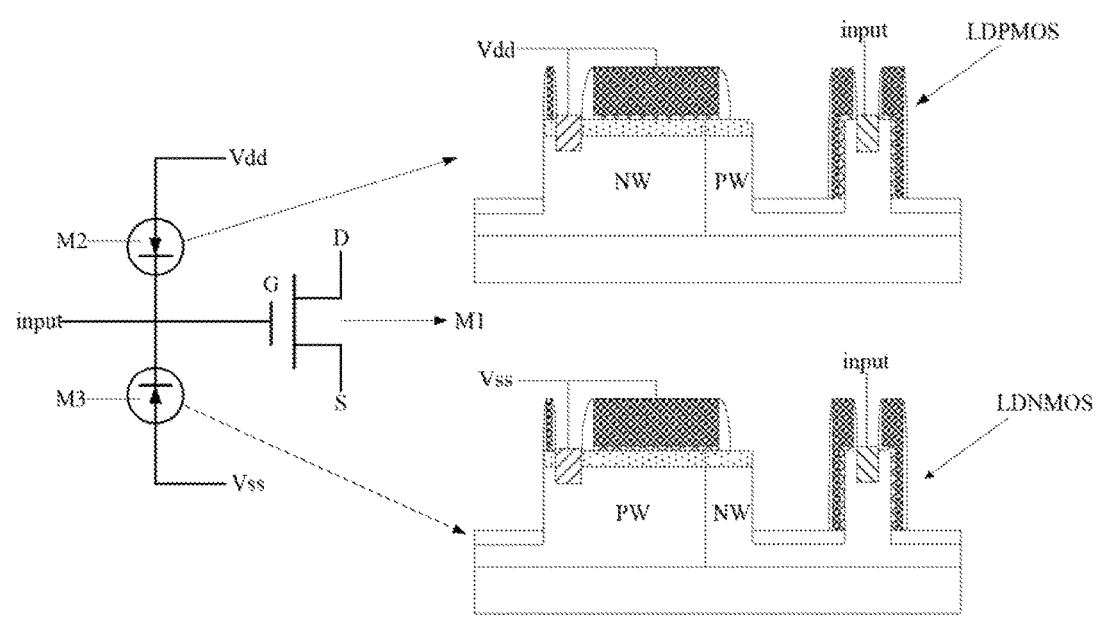
FIG. 13 illustrates circuits of an ESD device consistent with the disclosed embodiments.

FIG. 13 illustrates a schematic diagram of an ESD device circuit. The ESD device may include a MOS transistor M1, a LDPMOS transistor M2, and a LDNMOS transistor M3. The MOS transistor M1 may include a first gate G, a first drain D and a first source S. The LDPMOS transistor M2 may include a second gate, a second drain and a second source. The second gate and the second source may be connected to a high level, and the second drain may be connected to the first gate G. The LDNMOS transistor M3 may include a third gate, a third drain and a third source. The third gate and the third drain may be connected to a low level, and the third drain may be connected to the first gate G. The first gate may also be connected to an input terminal. Specifically, the first drain, the second gate and the second source may be connected to $V_{dd}$, and the first source, the third gate and the third source may be connected to $V_{ss}$.

The second gate may correspond to the gate structure or the metal gate structure of the LDPMOS transistor M2. The second drain may correspond to the drain region of the LDPMOS transistor M2. The second source may correspond to the source region of the LDPMOS transistor M2. The third gate may correspond to the gate structure or the metal gate structure of the LDNMOS transistor M3. The third drain may correspond to the drain region of the LDNMOS transistor M3. The third source may correspond to the source region of the LDNMOS transistor M3.

When a negative electrostatic discharge pulse is inputted from the input terminal, the voltage between the second source and the second drain of the LDPMOS transistor M2 may reach the needed trigger voltage of the LDPMOS transistor M2, then electrostatic discharge current from the second source to the second drain may be formed in the LDPMOS transistor M2. Therefore, it may raise the negative electrostatic discharge pulse, lower the absolute value of the negative electrostatic discharge pulse, and avoid breakdown of the MOS transistor M1.

When a positive electrostatic discharge pulse is inputted from the input terminal, the voltage between the third source and the third drain of the LDNMOS transistor M3 may reach the needed trigger voltage of the LDNMOS transistor M3, then electrostatic discharge current from the third drain to the third source may be thrilled in the LDNMOS transistor M3. Therefore, it may lower the positive electrostatic discharge pulse, lower the absolute value of the positive electrostatic discharge pulse, and avoid breakdown of the MOS transistor M1.

Accordingly, the LDMOS transistor consistent with the disclosed embodiments may include the first ion doping region formed in the well area and the first region. The first ion doping region may be doped with the first ions, and the type of the first ions may be the same as the type of the first well ion and opposite to the type of the second well ion. Since the type of the first ions may be the same as the type of the first well ion, such that the first ion doping region formed in the first well area may be capable of adjusting the threshold voltage of the LDMOS transistor. Since the type of the first ions may be opposite to the type of the second well ion, such that the first ions in the first ion doping region formed in the first region may neutralize part of the second well ion in the first region, so as to decrease the concentration of the ions with type corresponding to the second well ion. Therefore, the width of the depletion layer formed between the first region and the first well area may be increased, and the electric field intensity in the depletion layer may be reduced, so as to improve the hot carrier effect of the LDMOS transistor. Therefore, the LDMOS transistor consistent with the disclosed embodiments may improve the hot carrier effect of the LDMOS transistor while adjusting the threshold voltage of the LDMOS transistor, so as to improve the electrical performance of the LDMOS transistor.

Since the ESD device consistent with the disclosed embodiments may include an LDMOS transistor including the first ion doping region, such that the electrical performance of the ESD device may be improved.

Forming the LDMOS transistor consistent with the disclosed embodiments may include forming the first ion doping region in the well area and the first region. The first ion doping region may be doped with the first ions, and the type of the first ions may be the same as the type of the first well ion and opposite to the type of the second well ion. Since the type of the first ions may be the same as the type of the first well ion, such that the first ion doping region formed in the first well area may be capable of adjusting the threshold voltage of the LDMOS transistor. Since the type of the first ions may be opposite to the type of the second well ion, such that the first ions in the first ion doping region formed in the first region may neutralize part of the second well ion in the first region, so as to decrease the concentration of the ions with type corresponding to the second well ion. Therefore, the width of the depletion layer formed between the first region and the first well area may be increased, and the electric field intensity in the depletion layer may be reduced, so as to improve the hot carrier effect of the LDMOS transistor.

Forming the ESD device consistent with the disclosed embodiments may include forming an LDMOS transistor including the first ion doping region, such that the electrical performance of the ESD device may be improved.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A laterally diffused metal-oxide-semiconductor (LDMOS) transistor, comprising:
    a base substrate;
    a first well area formed in the base substrate, wherein the first well area is doped with a first well ion;
    a second well area formed in the base substrate, wherein the second well area is formed on a side of the first well area, abutting directly against the first well area and doped with a second well ion, and
    the second well area includes a first region adjacent to the first well area and doped with the second well ion, the first region abutting directly against the first well area;
    a first ion doping region formed in the first well area and the first region, wherein the first ion doping region in the first well area is doped with first ions, the first ion doping region in the first region is doped with first ions to neutralize the second well ion in the first region, and a type of the first ions is the same as a type of the first well ion and opposite to a type of the second well ion; and
    a gate structure formed on part of the first well area and part of the first region.

2. The LDMOS transistor according to claim 1, wherein:
    the first ion doping region formed in the first well area is suitable to adjust threshold voltage of the LDMOS transistor.

3. The LDMOS transistor according to claim 1, wherein:
    a type of the LDMOS transistor is P-type; and
    the first ions are N-type ions.

4. The LDMOS transistor according to claim 1, wherein:
    a type of the LDMOS transistor is N-type; and
    the first ions are P-type ions.

5. The LDMOS transistor according to claim 1, wherein:
    the first ion doping region is also doped with second ions; and
    the second ions are carbon ions or fluorine ions.

6. The LDMOS transistor according to claim 1, wherein:
    the gate structure is formed on part of the first well area and part of the first region; or
    the gate structure is formed on part of the first well area and the entire first region.

7. The LDMOS transistor according to claim 1, further including:
    a source region, wherein the source region is formed in the first well area in one side of the gate structure.

8. The LDMOS transistor according to claim 7, wherein:
    dimensions of the first ion doping region along a direction normal to top surface of the base substrate are larger than dimensions of the source region along the direction normal to the top surface of the base substrate; or
    the dimensions of the first ion doping region along the direction normal to the top surface of the base substrate are smaller than the dimensions of the source region along the direction normal to the top surface of the base substrate; or
    the dimensions of the first ion doping region along the direction normal to the top surface of the base substrate is equal to the dimensions of the source region along the direction normal to the top surface of the base substrate.

9. The LDMOS transistor according to claim 1, wherein:
    the second well area also includes a second region, wherein the second region is adjacent to the first region, and the second region and the first well area are formed at both sides of the first region.

10. The LDMOS transistor according to claim 9, further including:
    a drain region, wherein the drain region is formed in the second region.

11. The LDMOS transistor according to claim 10, further including:
    an isolation structure, wherein the isolation structure is formed in the second region between the first region and the drain region.

12. The LDMOS transistor according to claim 11, wherein:
    the gate structure is formed on part of the first well area, the entire first region and part of the isolation structure.

13. An electrostatic discharge (ESD) device comprising:
    the laterally diffused metal-oxide-semiconductor (LDMOS) transistor according to claim 1.

14. A method for fabricating an LDMOS transistor, comprising:
    providing a base substrate;
    forming a first well area in the base substrate, wherein the first well area is doped with a first well ion;
    forming a second well area in the base substrate, wherein the second well area is formed on a side of the first well area, abutting directly against the first well area and doped with a second well ion, and
    the second well area includes a first region adjacent to the first well area and doped with the second well ion, the first region abutting directly against the first well area;
    forming a first ion doping region in the first well area and the first region, wherein the first ion doping region in the first well area is doped with first ions, the first ion doping region in the first region is doped with first ions to neutralize the second well ion in the first region, and a type of the first ions is the same as a type of the first well ion and opposite to a type of the second well ion; and forming a gate structure on part of the first well area and part of the first region.

15. The electrostatic discharge (ESD) device according to claim 13, wherein:
   the gate structure is formed on part of the first well area and part of the first region; or
   the gate structure is formed on part of the first well area and the entire first region.

16. A laterally diffused metal-oxide-semiconductor (LDMOS) transistor, comprising:
   a base substrate;
   a first well area formed in the base substrate, wherein the first well area is doped with a first well ion;
   a second well area formed in the base substrate, wherein the second well area is formed on a side of the first well area, abutting directly against the first well area and doped with a second well ion, and
   the second well area includes a first region adjacent to the first well area and doped with the second well ion, the first region abutting directly against the first well area;
   a first ion doping region formed in the first well area and the first region, wherein the first ion doping region is doped with first ions, and a type of the first ions is the same as a type of the first well ion and opposite to a type of the second well ion; and
   a gate structure formed on part of the first well area and part of the first region, wherein:
      the second well area also includes a second region, wherein the second region is adjacent to the first region, and the second region and the first well area are formed at both sides of the first region the base substrate includes a fin structure, the fin structure including a first fin and a second fin,
the first region is formed in the first fin,
the first ion doping region is formed in the first fin and covers a top of the first fin, and
the second region includes:
   a first portion adjacent between the first fin and the second fin, the first portion being adjacent to the first region;
   a second portion in the second fin, the second portion being adjacent to the first portion.

17. The method for fabricating an LDMOS transistor according to claim 14, wherein:
   the second well area also includes a second region, wherein the second region is adjacent to the first region, and the second region and the first well area are formed at both sides of the first region.

18. The method for fabricating an LDMOS transistor according to claim 17, wherein:
   the base substrate includes a fin structure, the fin structure including a first fin and a second fin,
   the first region is formed in the first fin, and
   the second region includes:
   a first portion adjacent between the first fin and the second fin, the first portion being adjacent to the first region;
   a second portion in the second fin, the second portion being adjacent to the first portion.

19. The LDMOS transistor according to claim 16, wherein the first fin and the second fin are aligned in an extension direction of the fin structure.

20. The LDMOS transistor according to claim 16, wherein the second well area extends along a direction from the first fin to the second fin into the second fin and the semiconductor substrate under the second fin sub-portion.

* * * * *